United States Patent [19]
Takai

[11] Patent Number: 6,137,320
[45] Date of Patent: Oct. 24, 2000

[54] INPUT RECEIVER CIRCUIT

[75] Inventor: Yasuhiro Takai, Tokyo, Japan

[73] Assignee: NEC Corporation, Tokyo, Japan

[21] Appl. No.: 09/266,067

[22] Filed: Mar. 10, 1999

[30] Foreign Application Priority Data

Mar. 18, 1998 [JP] Japan .................................. 10-068592

[51] Int. Cl.[7] .............................................. G01R 19/00
[52] U.S. Cl. ............................... 327/56; 327/77; 327/78; 327/81
[58] Field of Search .................................. 327/379, 387, 327/388, 403, 404, 407, 408, 409, 410, 108, 50, 51, 52, 53, 54, 55, 56, 77, 78, 79, 80, 81, 88

[56] References Cited

U.S. PATENT DOCUMENTS

| | | | |
|---|---|---|---|
| 4,461,964 | 7/1984 | Shiotari | 327/88 |
| 5,148,063 | 9/1992 | Hotta | 327/170 |
| 5,789,948 | 8/1998 | Kim et al. | 327/55 |
| 5,883,535 | 3/1999 | Kato | 327/170 |

*Primary Examiner*—Timothy P. Callahan
*Assistant Examiner*—Hai L. Nguyen
*Attorney, Agent, or Firm*—Scully, Scott, Murphy & Presser

[57] ABSTRACT

An input receiver circuit which is capable of reducing a difference between a propagation time at the rise-up and that at the fall of an input signal and is suitably used for semiconductor memory devices. The input receiving circuit comprises a node, six N channel (N-ch) MOS transistors and two P channel (P-ch) MOS transistors. The first and second N-ch transistors receive an activation signal and have grounded sources. The third and fourth N-ch transistors receive the first and second signal and have sources connected to the drains of the first and second N-ch transistors, respectively. The fifth and sixth N-ch transistors have gates connected to the node and are provided in parallel to the third and fourth N-ch transistors, respectively. Sources of the first and second P-ch transistors are supplied with the power source voltage. Drains of the first and second P-ch transistors are connected to the drains of the third and fourth N-ch transistors, respectively. Gates of the first and second P-ch transistors are connected to the node. The second P-ch transistor outputs a drain voltage as an output signal.

14 Claims, 14 Drawing Sheets

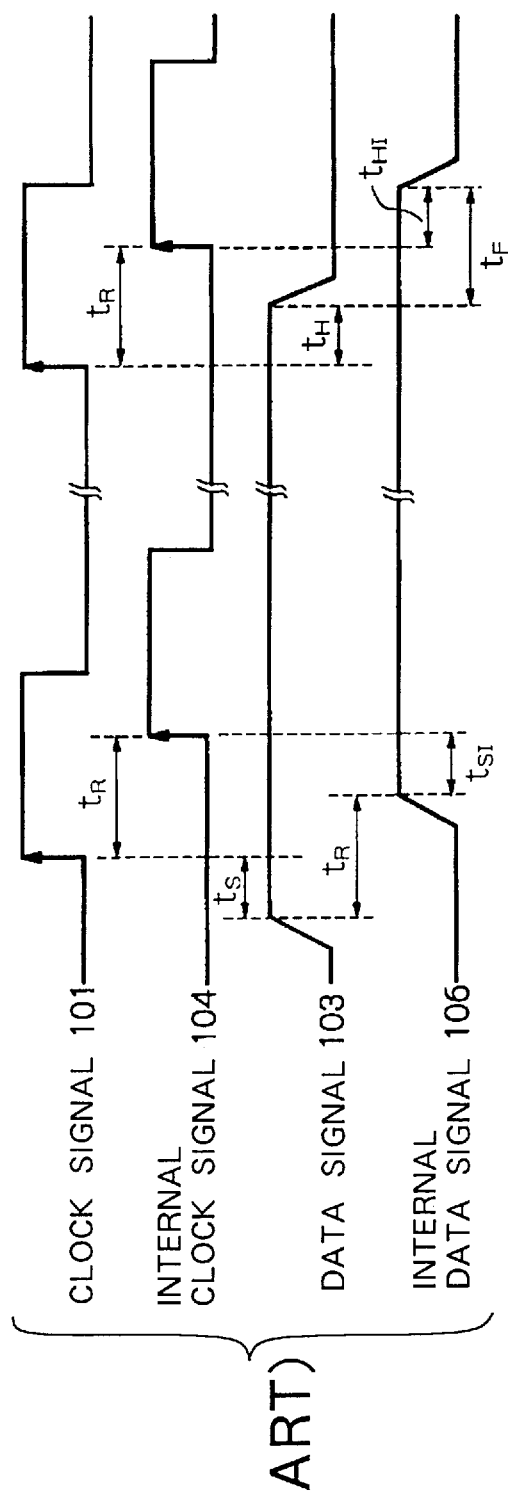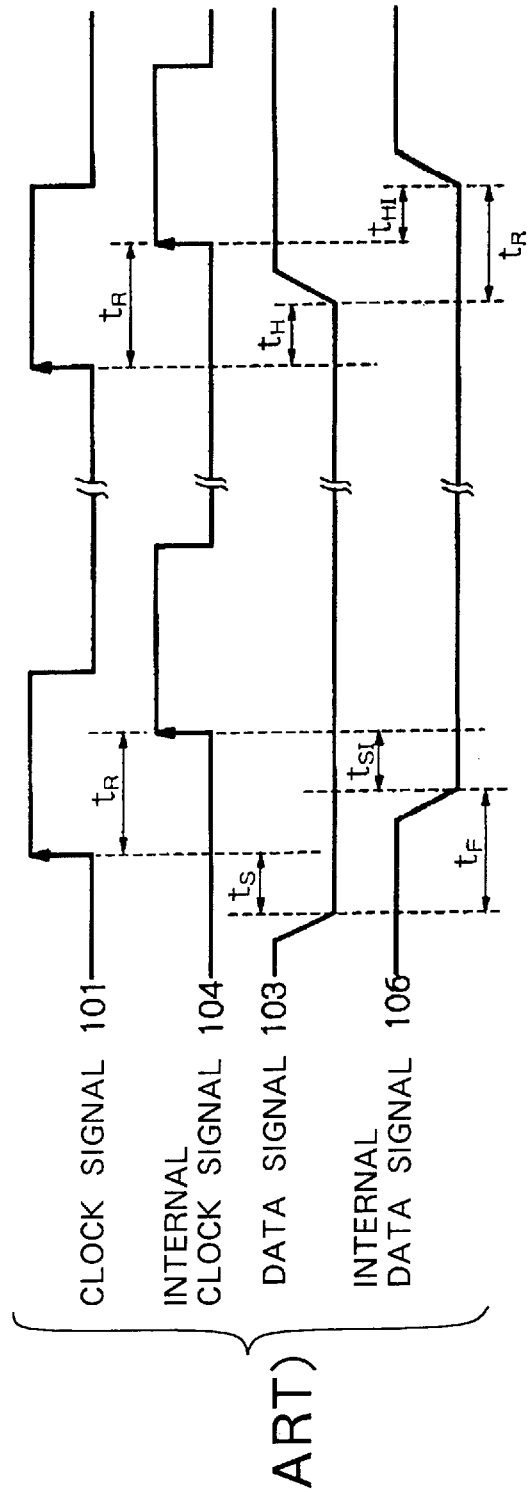
FIG. 5A (PRIOR ART)
FIG. 5B (PRIOR ART)

INPUT RECEIVER CIRCUIT

BACKGROUND OF THE INVENTION

1. Field of the Invention

The present invention relates to an input receiver circuit used for transmitting a signal inputted from the outside to an internal circuit, more particularly to an input receiver circuit suitably used as an input circuit in semiconductor memory devices and the like.

2. Description of the Prior Arts

An input receiver circuit is installed in an integrated circuit (IC) such as a semiconductor memory device and receives a signal to be supplied to the integrated circuit from the outside, converts the received signal to an internal signal, and then supplies it to each of circuit blocks in the integrated circuit.

FIG. 1 shows the constitution of principal parts of a semiconductor memory device having the input receiver circuit. In FIG. 1, semiconductor memory device 1, mainly a signal input section thereof, is illustrated.

Semiconductor memory device 1 illustrated in FIG. 1 is constituted as an SDRAM (Synchronous Dynamic Random Access Memory). Semiconductor memory device 1 comprises flip-flop circuits 3 and 4; input receiver circuits $7_1$, $7_2$ and $7_3$; memory cell array 9 in which a plurality of memory cells are arranged; column decoder 23 for supplying column addresses to memory cell array 9 after decoding them; row decoder 22 for supplying row addresses to memory cell array 9 after decoding them; and sense amplifier 24 provided between memory cell array 9 and row decoder 22. Clock signal 101, address signal 102 and data signal 103 are supplied to this semiconductor memory device 1 from the outside thereof. These signals 101 to 103 are once received respectively by input receiver circuits $7_1$, $7_2$ and $7_3$, and transmitted to the internal circuits as internal clock signal 104, internal address signal 105 and internal data signal 106, respectively. Flip-flop circuits 3 and 4 latch internal address signal 105 and internal data signal 106, respectively, in synchronization with the leading edge of internal clock signal 104. Then, internal address signal 105 latched by flip-flip circuit 3 is inputted to column decoder 23 and row decoder 22, and internal data signal 106 latched by flip-flop circuit 4 is inputted to sense amplifier 24, whereby data reading/writing operations for memory cell array 9 are performed. As described above, an SDRAM for latching the data signal and the address signal in synchronization with the rise-up of the clock signal, that is, an SDRAM in which data strobe is performed in a single direction, shall be hereinafter referred to as an SDR (Single Data Rate)-SDRAM.

FIG. 2 shows the constitution of each of input receiver circuits $7_1$, $7_2$ and $7_3$. Each of these conventional input receiver circuit comprises N channel MOS (metal-oxide-semiconductor) transistors 11 to 14, P channel MOS transistors 15 and 16, and inverter 21.

Activation signal 10 is inputted to each gate of N channel MOS transistors 11 and 12, and the source of each of transistors 11 and 12 is grounded. N channel MOS transistors 11 and 12 are power cutting transistors which reduce power consumption by cutting off current flowing through the circuit, when the input receiver circuit is not operated, for example, in the case of a power down mode. Activation signal 10 is a signal which takes a ground potential when the input receiver circuit is made to be an inactive state.

N channel MOS transistor 13 receives at its gate the reference voltage $V_{REF}$ that is half that of the power source voltage, and the source thereof is connected to the drain of N channel MOS transistor 11. The source of P channel MOS transistor 15 is supplied with the power source voltage $V_{CC}$ and the drain thereof is connected to the drain of N channel MOS transistor 13. The gate and drain of P channel MOS transistor 15 are connected to each other. The source of P channel MOS transistor 16 is supplied with the power source voltage, and the gate thereof is connected to the gate of P channel transistor 15. The gates of P channel MOS transistors 15 and 16 are mutually connected by node 33. The drain of N channel MOS transistor 14 is connected to the drain of P channel MOS transistor 12, the gate thereof is applied with an input signal $V_{IN}$, and the source thereof is connected to the drain of N channel MOS transistor 12. Inverter 21 receives the drain voltage of P channel MOS transistor 16, and inverts the logical level of the drain voltage of the P channel MOS transistor 16 to output it as an output signal $V_{OUT}$. Inverter 21 is provided so that a signal amplitude ranging from the ground potential to the power source voltage is secured and the logical values of the input signal $V_{IN}$ and the output signal $V_{OUT}$ are made to be equal.

Next, an operation of the conventional input receiver circuit will be described with reference to FIG. 2.

As the voltage of the input signal $V_{IN}$ becomes higher, the on-resistance of N channel MOS transistor 14 is allowed to be smaller, so that the drain voltage of P channel MOS transistor 16 becomes lower. On the contrary, as the voltage of the input signal $V_{IN}$ becomes lower, the on-resistance of N channel MOS transistor 14 is allowed to be larger, so that the drain voltage of P channel MOS transistor 16 becomes higher.

When the reference voltage $V_{REF}$ becomes low, the on-resistance of N channel MOS transistor 13 becomes larger, so that the potential at node 33 becomes higher. For this reason, the gate voltages of P channel MOS transistors 15 and 16 become higher, so that the on-resistance of P channel MOS transistor 16 becomes larger, resulting in a lower drain voltage of P channel MOS transistor 16.

As described above, the input receiver circuit operates as a differential comparator for deciding the logical value of the input signal $V_{IN}$ using the reference voltage $V_{REF}$ as a reference. Specifically, when input signal $V_{IN}$ becomes higher than the reference voltage $V_{REF}$, the output signal $V_{OUT}$ becomes high in level, and when the signal $V_{IN}$ becomes lower than the voltage $V_{REF}$, the signal $V_{OUT}$ becomes low in level.

With reference to input/output voltages of the semiconductor memory devices, there has been standards such as a SSTL-2 interface defined by JEDEC (Joint Electronic Device Engineering Council-Electronic Industrial Association). In the SSTL-2 interface standard, a comparatively low voltage, for example, $V_{REF}$=1.25±0.1 V, $V_{IN}$(max)/$V_{IN}$(min)=$V_{REF}$±0.35 V. Here, the input voltage $V_{IN}$ becomes the lowest voltage, when $V_{REF}$=1.15 V and $V_{IN}$(min)=$V_{REF}$−0.35 V. $V_{IN}$(min) in this case is 0.8 V as is obtained from the following equation (1).

$$V_{IN}(min)=V_{REF}-0.35=1.15-0.35=0.8V \qquad (1)$$

When the threshold voltage of N channel MOS transistor 14 is assumed to be $V_{TN}$ and the voltage between the gate and source thereof is assumed to be $V_{GS}$, the current I flowing from the drain of N channel MOS transistor 14 to the source thereof can be obtained by the following equation (2).

$$I=\beta/2\times(V_{GS}-V_{TN})^2 \qquad (2)$$

In the equation (2), $\beta$ is a coefficient expressed by $\beta = W \cdot \mu \cdot C_0 / L$, W is the gate width, $\mu$ is the surface mobility of conduction electrons passing through the channel, $C_0$ is the capacitance of the gate oxide film, and L is the gate length.

Here, even when the voltage between the source and drain of N channel MOS transistor 12 is neglected, $V_{GS}$ is equal to 0.8 V as is obtained from the equation (1) because $V_{GS}$ is approximately equal to $V_{IN}$. When the input receiver circuit is designed assuming that threshold voltage $V_{TN}$ of N channel MOS transistor 14 is 0.6 V, the actual threshold voltage $V_{TN}$ varies at a range of about ±0.15 V due to the unevenness of the ion implantation amount in the fabricating processes. Therefore, in the worst case, the threshold voltage $V_{TN}$ will be equal to 0.75 V. The current I is expressed by the following equation (3) when these values are substituted into the equation (2).

$$I = \beta/2 \times (0.8 - 0.75)^2 \quad (3)$$

Referring to the equation (3), since $(V_{GS} - V_{TN})$ is as small as 0.05, also the value of the current I becomes small. Actually, since the voltage between the source and drain of N channel MOS transistor 12 is not equal to zero, VGS <0.8 V is satisfied, so that the current I becomes further smaller. For this reason, in N channel MOS transistor 14, the gain for the input signal $V_{IN}$ can not almost be obtained.

FIG. 3 is a graph showing the results of the changes in the propagation time with respect to the reference voltage $V_{REF}$, which are obtained by simulations, when the input signal $V_{IN}$ takes the minimum value in the case of the worst $V_{TN}$ in the conventional receiver circuit of FIG. 2. In the graph of FIG. 3, the solid line represents the propagation time when the input signal $V_{IN}$ rises up, and the broken line represents the propagation time when the input signal $V_{IN}$ falls. Here, the propagation time is a period of time in which the output signal $V_{OUT}$ changes from high level to low level after the input signal $V_{IN}$ transits from high level to low level. Or, the propagation time is a period of time in which the output signal $V_{OUT}$ changes from low level to high level after the input signal $V_{IN}$ transits from low level to high level. The difference between the propagation time when the input signal changes from high level to low level and the propagation time when it changes from low level to high level is a propagation time difference.

Referring to the graph of FIG. 3, when the reference voltage $V_{REF}$ is 1.15 V, the propagation time at the rise-up of the input signal is 1.26 ns and the propagation time at the fall of the input signal is 0.87 ns. In this case, the propagation time difference is 0.39 ns (≈0.4 ns) obtained by subtracting 0.87 from 1.26. When the reference voltage $V_{REF}$ is 1.15 V, the propagation time difference is about 0.4 ns, and the propagation time when the input signal changes from low level to high level is shorter than the propagation time when it changes from high level to low level by 0.4 ns.

To shorten the propagation time difference, it is satisfactory that the standard value of the threshold voltage of N channel MOS transistor 14 (see FIG. 2) is made to be further lower than 0.6 V. However, when the threshold value $V_{TN}$ of N channel MOS transistor 14 is lowered, threshold values of other N channel MOS transistors formed in the same fabricating processes are also lowered. If these N channel MOS transistors are used in locations where a voltage is applied in a stand-by state, a sub-threshold current of the MOS transistor can not be neglected, resulting in an increase in a leak current. For this reason, this leads to the fact that the semiconductor memory device can not satisfy a specification for the stand-by current of the whole of the semiconductor memory device. On the other hand, the foregoing problem can be solved when fabrication processes for forming N channel MOS transistor are exclusively provided and only the threshold voltage of N channel MOS transistor 14 is lowered while leaving threshold voltages of other N channel MOS transistors as they are. However, in order to achieve this, the sorts of the threshold values to be set in a process design increase and the number of processes increases, leading to an increase in cost of the semiconductor memory device.

FIG. 4 is a timing chart showing a relation between clock signal 101 and data signal 103 in the foregoing conventional SDR-SDRAM which latches the data signal and the address signal at the leading edge of the clock signal. Here, a frequency of clock signal 101 shall be set to 100 MHz. Periods of both of clock signal 101 and internal clock signal 104 are 10 ns.

In the SDR-SDRAM, internal data signal 103 is latched by the rise-up of internal clock signal 104 in flip-flop circuit 4. Here, in order to allow flip-flop circuit 4 to securely latch internal data signal 106 at the leading edge of internal data signal 104, internal data signal 106 must be kept so as not to make a change, for a certain period of time immediately before and after the rise-up of internal clock signal 104. Thus, a set-up time 30 in which internal data signal 106 must be kept before internal clock signal 104 rises up and a hold time 31 in which internal data signal 106 must be kept after internal clock signal 104 rises up are required for flip-flop circuit 4. A total of the set-up time and the hold time is called a window time of flip-flop circuit 4. The foregoing set-up time, the hold time and the window time are defined for each of internal clock signal 104 and internal data signal 106, and the set-up time, the hold time and the window time are similarly defined also for clock signal 101 and data signal 103.

As shown in FIG. 4, a time in which data signal 103 must be kept before clock signal 101 rises up is set-up time 30, and a time in which data signal 103 must be kept after clock signal 101 rises up is hold time 31. The total time of set-up time 30 and hold time 31 is window time 32 of data signal 103. Window time 32 of data signal 103 is a time obtained by adding the propagation time difference of input receiver circuits $7_1$ to $7_3$ to the window time of flip-flop circuit 4.

Next, the situations of changes of the window time by the propagation time difference of the input receiver circuits will be described using FIGS. 5A and 5B. FIG. 5A is a timing chart in the case where high level data is latched at the leading edge of the clock signal, and FIG. 5B is a timing chart in the case where low level data is latched at the leading edge of the clock signal. Here, $t_R$ represents the propagation time at the rise-up of the clock signal 101; $t_F$, the propagation time at the fall of the internal data signal 106; $t_S$, the set-up time of data signal 103; $t_H$, the hold time of data signal 103; $t_{SI}$, the set-up time of flip-flop circuit 4; and $t_{HI}$, the hold time of flip-flop circuit 4. In order to make the concrete description, as described above, the propagation time difference $(t_F - t_R)$ of the input receiver circuit in the worst case at the range of the specification values shall be 0.4 ns as shown in FIG. 3. The set-up time $t_S$ and the hold time $t_H$ when high level data signal 103 is latched by the rise-up of clock signal 101 are respectively obtained by the following equations (4) and (5), as is illustrated in FIG. 5A.

$$t_S = t_{SI} + t_R - t_R = t_{SI} \quad (4)$$

$$t_H = t_{HI} + t_R - t_F = t_{HI} - 0.4 \quad (5)$$

As is understood from the equation (4), the set-up time $t_S$ of data signal 103 is equal to the set-up time $t_{SI}$ of flip-flop circuit 4, and it is not degraded by the input receiver circuits. Moreover, as is understood from the equation (5), the hold time $t_H$ of data signal 103 is shorter than the hold time $t_{HI}$ of flip-flop circuit 4 by 0.4 ns, and it is not also degraded by the input receiver circuits.

On the other hand, the set-up time $t_S$ and the hold time $t_H$ when low level data signal 103 is latched at the time of the rise-up of clock signal 101 are respectively obtained by the following equations (6) and (7), as is illustrated in FIG. 5B.

$$t_S = t_{SI} + t_R - t_R = t_{SI} + 0.4 \quad (6)$$

$$t_H = t_{HI} + t_R - t_F = t_{HI} \quad (7)$$

As is understood from the equation (6), the set-up time $t_S$ of data signal 103 is longer than the set-up time $t_{SI}$ of flip-flop circuit 4 by 0.4 ns, and it is degraded by propagation time difference of the input receiver circuits. Moreover, as is understood from the equation (7), the hold time $t_H$ of data signal 103 is equal to the hold time $t_{HI}$ of flip-flop circuit 4, and it is not degraded by the input receiver circuits.

In the case where the propagation time difference ($t_F-t_R$) of the input receiver circuit is 0.4 ns, the set-up time $t_S$ of data signal 103 is longer than the set-up time $t_{SI}$ of flip-flop circuit 4 and becomes worse only when low level data signal 103 is latched at the time of the rise-up of clock signal 101. Specifically, the window of data signal 103 is longer than the window time of flip-flop circuit 4 by 0.4 ns that is the propagation time difference and it becomes worse.

In the foregoing descriptions, the case where the propagation time $t_F$ at the fall of the input receiver circuit is longer than the propagation time $t_R$ at the rise-up thereof was described. On the contrary, in the case where the time $t_R$ is longer than the time $t_F$, the hold time is degraded when high level data signal 103 is latched at the time of the rise-up of clock signal 101, As described above, when data signal 103 is latched only at the leading edge of clock signal 101 like the SDR-SDRAM, the window time of data signal 103 becomes longer than the window time of flip-flop circuit 4 by the propagation time, and becomes worse.

Besides the foregoing SDR-SDRAM, there have been some SDRAMs which each of uses a data latch signal other than the clock signal for latching the data signal and latches the data signal at both of its rise-up and fall. The SDRAM performing such bi-directional data strobe is called a DDR (Double Data Rate)-SDRAM. In the case where the conventional input receiver circuit is used in the DDR-SDRAM, the degradation of the window time due to the propagation time difference becomes more significant.

FIG. 6 shows the structure of a semiconductor memory device that is the DDR-SDRAM. Semiconductor memory device 41 shown in FIG. 6 differs from semiconductor memory device 1 shown in FIG. 1 in that input receiver circuit $7_4$, buffer 6, inverter 8, flip-flop circuit 5, and multiplexer 25 are newly added and data latch signal 107 is inputted from the outside.

Data latch signal 107 is once inputted to input receiver circuit $7_4$, and outputted therefrom as internal data latch signal 108. Internal data latch signal 108 is supplied to flip-flop circuit 4 via buffer 6, and supplied also to flip-flop circuit 5 via inverter 8. Buffer 6 generates the delay time equal to that of inverter 8, and is provided so that it compensates the delay time of inverter 8 in order to make the compensated delay time coincide with the timing of internal data latch signal 108 which is inputted to flip-flop circuits 4 and 5. Flip-flop circuit 4 latches internal data signal 106 at the timing when internal data latch signal 108 rises up, and flip-flop circuit 5 latches internal data signal 106 at the timing when internal data signal 108 falls. Multiplexer 25 multiplies the signal latched by flip-flop circuit 4 with the signal latched by flip-flop circuit 5, and outputs the calculation result to sense amplifier 24.

An operation of this DDR-SDRAM will be described with reference to the timing chart shown in FIG. 7. Here, the frequency of clock signal 101 shall be 100 MHz similarly to that described in FIG. 4, and the interval time between the rise-up and the fall of data latch signal 107 shall be 5 ns.

Internal data signal 106 is latched at intervals of 5 ns at the leading edge and the trailing edge of internal latch signal 108 in flip-flop circuits 4 and 5, respectively. In the DDR-SDRAM, since the intervals for latching internal data signal 106 are short, when the frequency of clock signal 101 is, for example, 100 MHz, the window time is about 1.5 ns.

Next, descriptions will be made on how the window time changes depending on the propagation time difference of the foregoing input receiver circuit when the input receiver circuit is used for the DDR-SDRAM. Here, in order to make the concrete description, the propagation time difference ($t_F-t_R$) of the input receiver circuit shall be 0.4 ns, as is shown in FIG. 3, in the worst case at the range of the specification values. An operation in the case where data signal 103 at high or low level is latched at the leading edge of clock signal 101 is the same as the operation shown in FIGS. 5A and 5B when the clock signal is only replaced by the data latch signal. Therefore, the window time between data latch signal 107 and data signal 103 becomes longer by 0.4 ns by the input receiver circuit and becomes worse.

An operation in which data signal 103 is latched at the trailing edge of data latch signal 107 will be described using FIGS. 8A and 8B. FIG. 8A show the timing chart when data signal at high level is latched at the trailing edge of the data latch signal, and FIG. 8B shows the timing chart when data signal at low level is latched at the trailing edge of the data latch signal.

The set-up time $t_S$ and the hold time $t_H$ when data signal 103 at high level is latched at the trailing edge of data latch signal 107 are obtained by the following equations (8) and (9), as is illustrated in FIG. 8A.

$$t_S = t_{SI} + t_R - t_F = t_{SI} - 0.4 \quad (8)$$

$$t_H = t_{HI} + t_R - t_R = t_{HI} \quad (9)$$

As is understood from the equation (8), the set-up time $t_S$ of data signal 103 is shorter than the set-up time $t_{SI}$ of flip-flop circuit 5, and it is not degraded by the input receiver circuit. As is understood from the equation (9), the hold time $t_H$ of data signal 103 is equal to the hold time $t_{HI}$ Of flip-flop circuit 5, and it is not degraded by the input receiver circuit.

The set-up time $t_S$ and the hold time $t_H$ when data signal 103 at low level is latched at the trailing edge of data latch signal 107 are obtained by the following equations (10) and (11), as illustrated in FIG. 8B.

$$t_S = t_{SI} + t_F - t_R = t_{SI} \quad (10)$$

$$t_H = t_{HI} + t_R - t_R = t_{HI} + 0.4 \quad (11)$$

As is understood from the equation (10), the set-up time $t_S$ of data signal 103 is equal to the set-up time $t_{SI}$ of flip-flop circuit 5, and it is not degraded by the input receiver circuit. As is understood from the equation (11), the hold time $t_H$ of data signal 103 is longer than the hold time $t_{HI}$ of flip-flop circuit 5 by 0.4 ns, and it is degraded by the input receiver circuit.

As described above, in the case where the propagation time difference ($t_F$–$t_R$) of the input receiver circuit is 0.4 ns, the set-up time $t_S$ of data signal 103 is longer than the set-up time $t_{SI}$ of flip-flop circuit 4 and is degraded when data signal 103 at low level is latched at the leading edge of data latch signal 107. Furthermore, when data signal 103 at low level is latched at the trailing edge of data latch signal 107, the hold time of data signal 103 becomes longer than the hold time of flip-flop circuit 5, and it becomes worse.

Specifically, the window time of data signal 103 is longer than the window time of flip-flop circuit 4 by 0.8 ns, twice 0.4 ns that is the propagation time difference, and it becomes worse.

The above descriptions was made for the case in which the propagation time $t_F$ at the fall of the input receiver circuit is longer than the propagation time $t_R$ at the rise-up thereof. In the case contrary to this, the set-up time becomes longer and is degraded when data signal 103 at high level is latched at the trailing edge of data latch signal 107, and the hold time is degraded when data signal 103 at high level is latched at the leading edge of the data latch signal 107.

As described above, when the input receiver circuit exhibiting the propagation time difference of 0.4 ns is used for the DDR-SDRAM, the window time between data signal 103 and data latch signal 107 becomes longer than the window time of flip-flop circuit 4 by 0.8 ns that is twice the propagation time difference. Considering other factors such as differences of pins supplied with the data signal and a temperature dependency, a margin of the window time for the typical value of 1.5 ns reduces. Then, the possibility that the window time exceeds the standard due to variations during manufacturing becomes large.

After all, in the foregoing input receiver circuit, the propagation time difference between the rise-up and the fall of the input signal is large. When the input receiver circuit is applied to, for example, the SDRAM, there has been a problem that the margin for the window time defined by the standard can not be secured.

SUMMARY OF THE INVENTION

The object of the present invention is to provide an input receiver circuit which is capable of reducing a propagation time difference and securing a margin for a standard value of a window time.

The object of the present invention can be achieved by an input receiver circuit which comprises: a first N channel MOS transistor having a gate supplied with an activation signal and a source connected to a ground potential; a second N channel MOS transistor having a gate supplied with the activation signal and a source connected to the ground potential; a third N channel MOS transistor having a gate supplied with a first signal and a source connected to a drain of the first N channel MOS transistor; a fourth N channel MOS transistor having a gate supplied with a second signal and a source connected to a drain of the second N channel MOS transistor; a node; a fifth N channel MOS transistor having a source connected to the source of the third N channel MOS transistor, a drain connected to a drain of the third N channel MOS transistor, and a gate connected to the node; a sixth N channel MOS transistor having a source connected to the source of the fourth N channel MOS transistor, a drain connected to a drain of the fourth N channel MOS transistor, and a gate connected to the node; a first P channel MOS transistor having a source supplied with a power source voltage, a drain connected to the drain of the third N channel MOS transistor, and a gate connected to the node; and a second P channel MOS transistor having a source supplied with the power source voltage, a drain connected to the drain of the fourth N channel MOS transistor, and a gate connected to the node, wherein the second P channel MOS transistor outputs a drain voltage as an output signal.

The input receiver circuit of the present invention provides the fifth and sixth N channel MOS transistors parallel to the third and fourth N channel MOS transistors, whereby an effect to amplify a first voltage, that is, the reference voltage itself, is suppressed. Furthermore, in the input receiver circuit of the present invention, the third and fourth P channel MOS transistors are provided parallel to the first and second P channel MOS transistors, and the input signal is amplified not only by the fourth N channel MOS transistor but also by the sixth P channel MOS transistor supplementarily, whereby a gain at the time when the reference voltage is minimum can be secured.

Therefore, according to the present invention, the propagation time difference is made to be small and a margin for a defined window time value can be secured.

The above and other objects, features, and advantages of the present invention will become apparent from the following description referring to the accompanying drawings which illustrate examples of preferred embodiments of the present invention.

BRIEF DESCRIPTION OF THE DRAWINGS

FIGS. 5A and 5B are timing charts for explaining an operation of the SDR-SDRAM;

DESCRIPTION OF THE PREFERRED EMBODIMENTS

Figure 1:
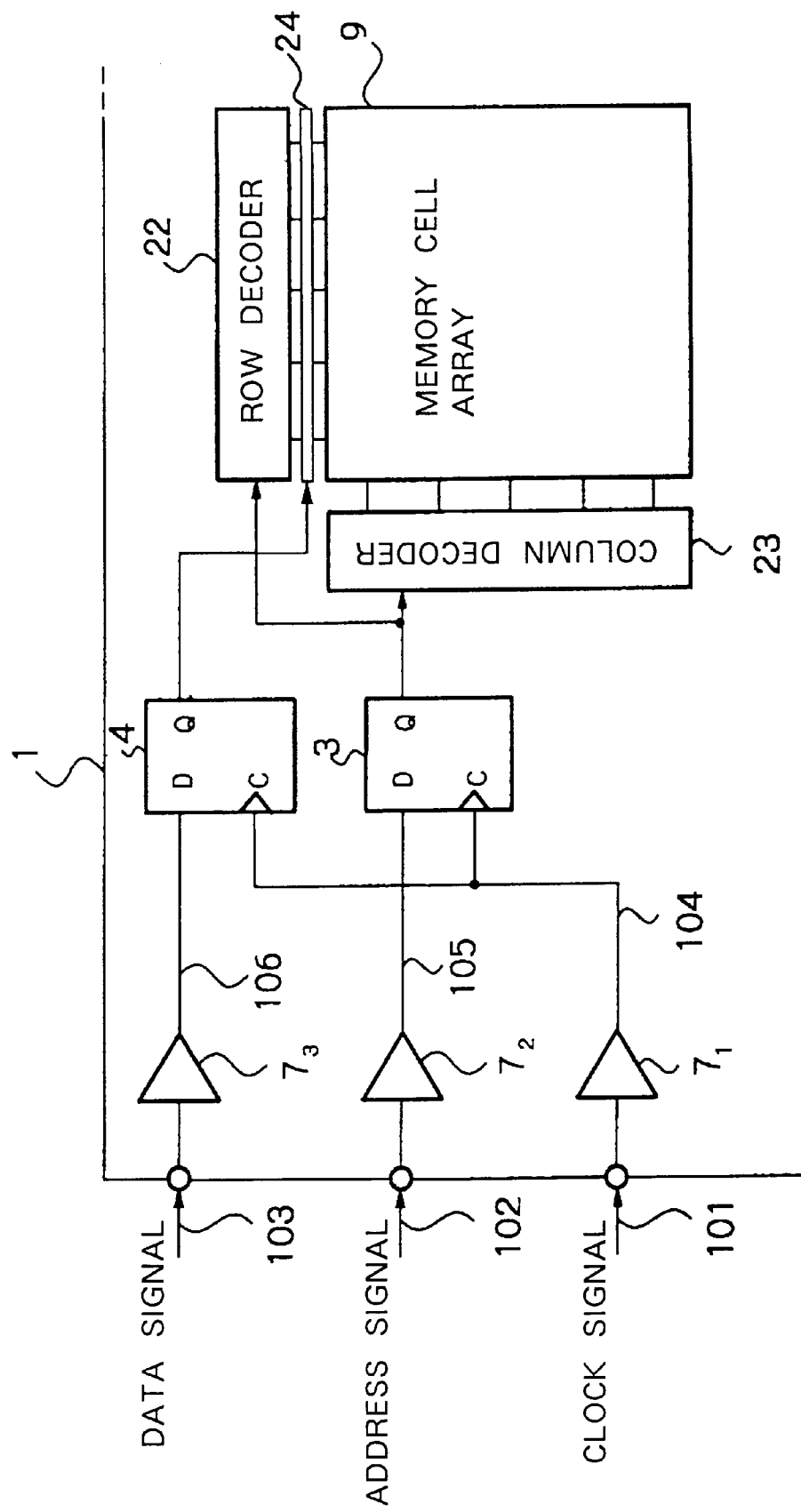
FIG. 1 is a block diagram showing the structure of a principal portion of an SDR (Single Data Rate)-SDRAM (Synchronous Dynamic Random Access Memory) which is provided with an input receiver circuit.
Figure 2:
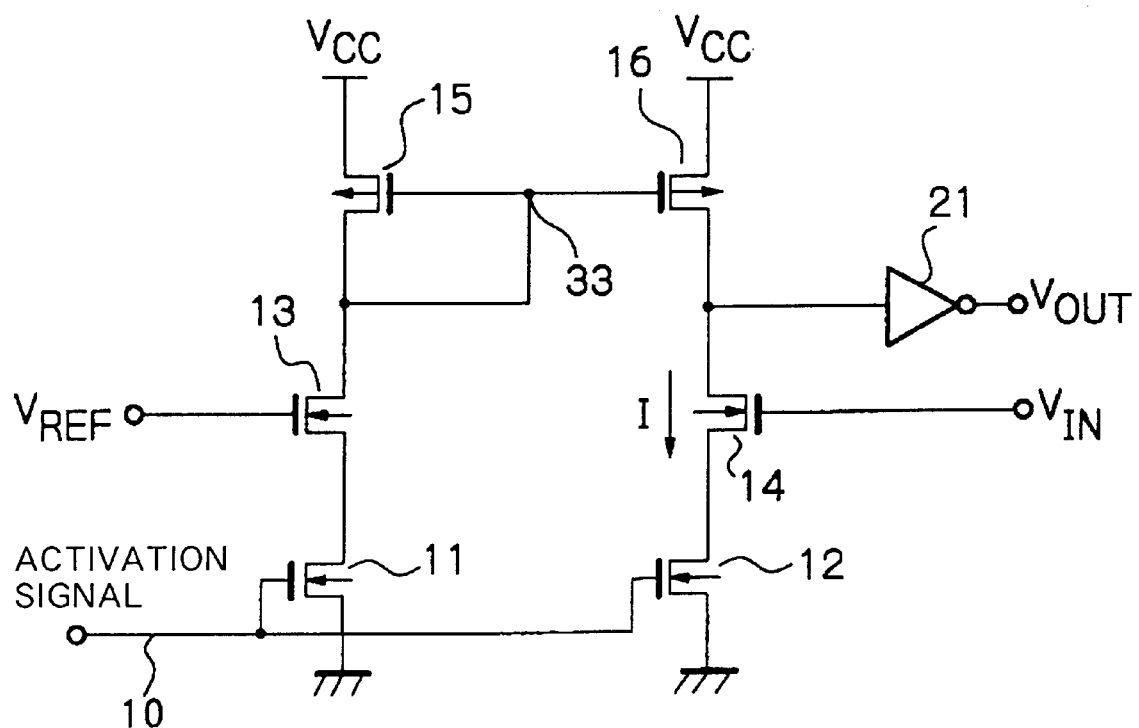
FIG. 2 is a circuit diagram showing the structure of a conventional input receiver circuit.
Figure 3:
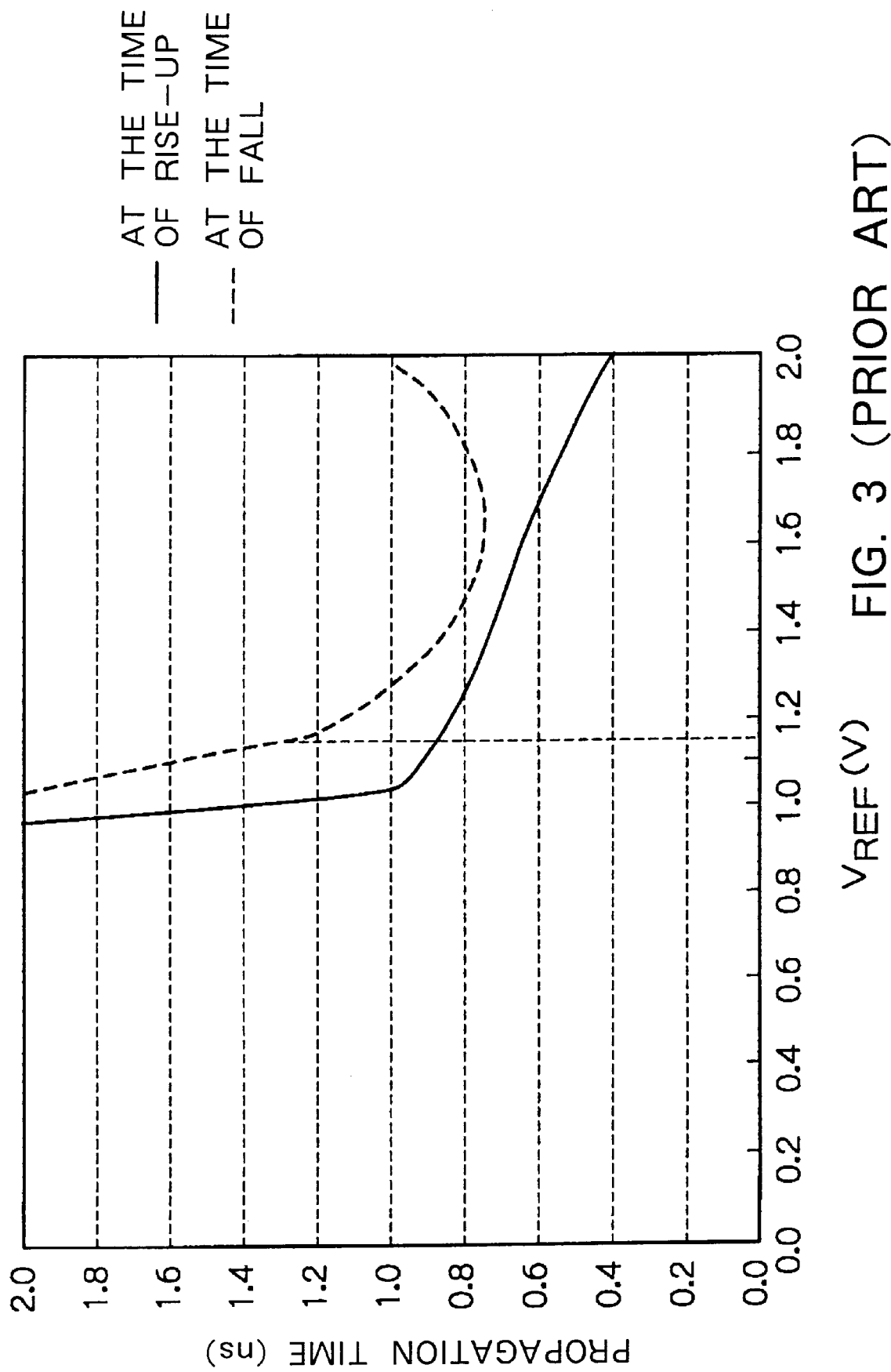
FIG. 3 is a graph showing a change of a propagation time with respect to a reference voltage $V_{REF}$ in the input receiver circuit shown in FIG. 2.
Figure 4:
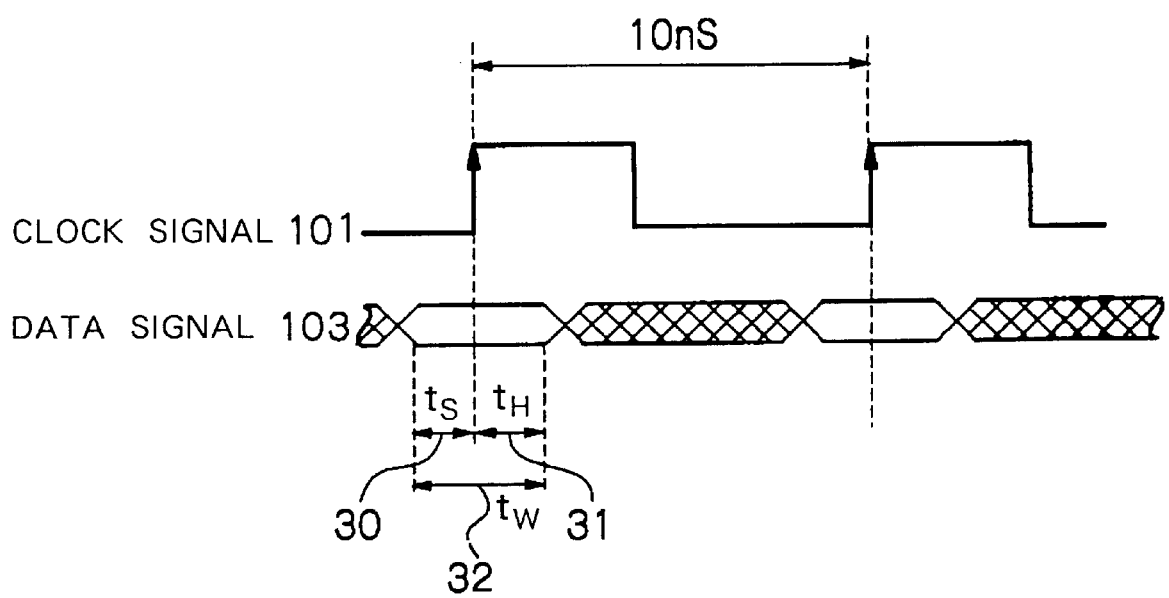
FIG. 4 is a timing chart for explaining a set-up time, a hold time and a window time.
Figure 6:
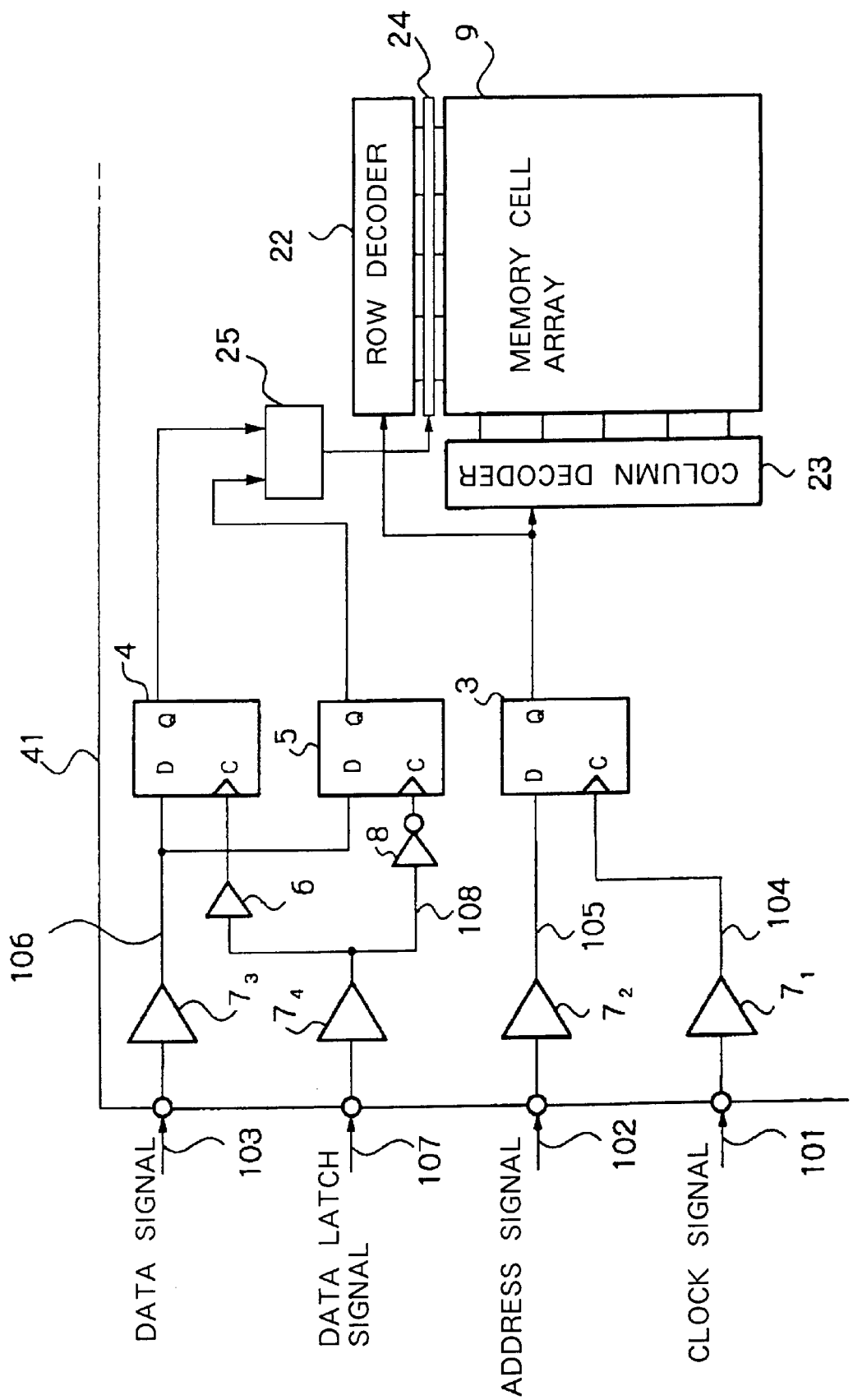
FIG. 6 is a block diagram showing the structure of a principal portion of a DDR (Double Data Rate)-SDRAM which is provided with an input receiver circuit.
Figure 7:
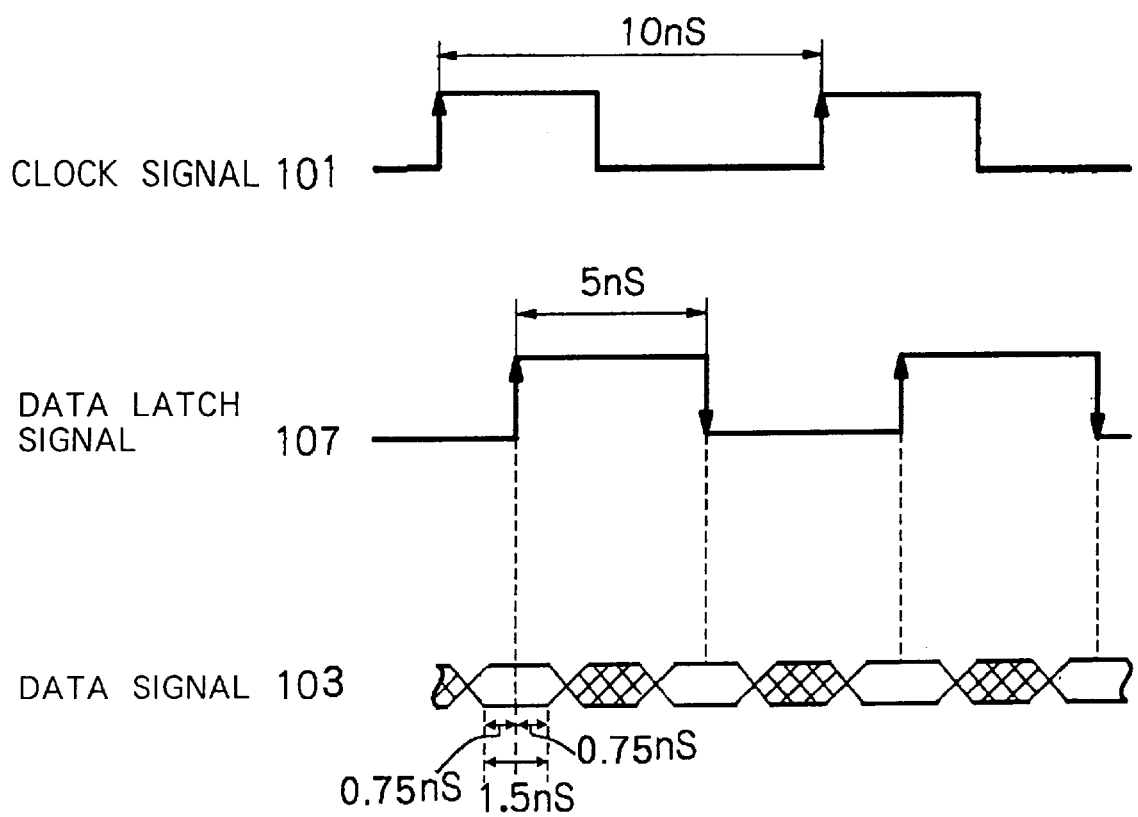
FIG. 7 is a timing chart for explaining an operation of the DDR-SDRAM.
Figure 8A:
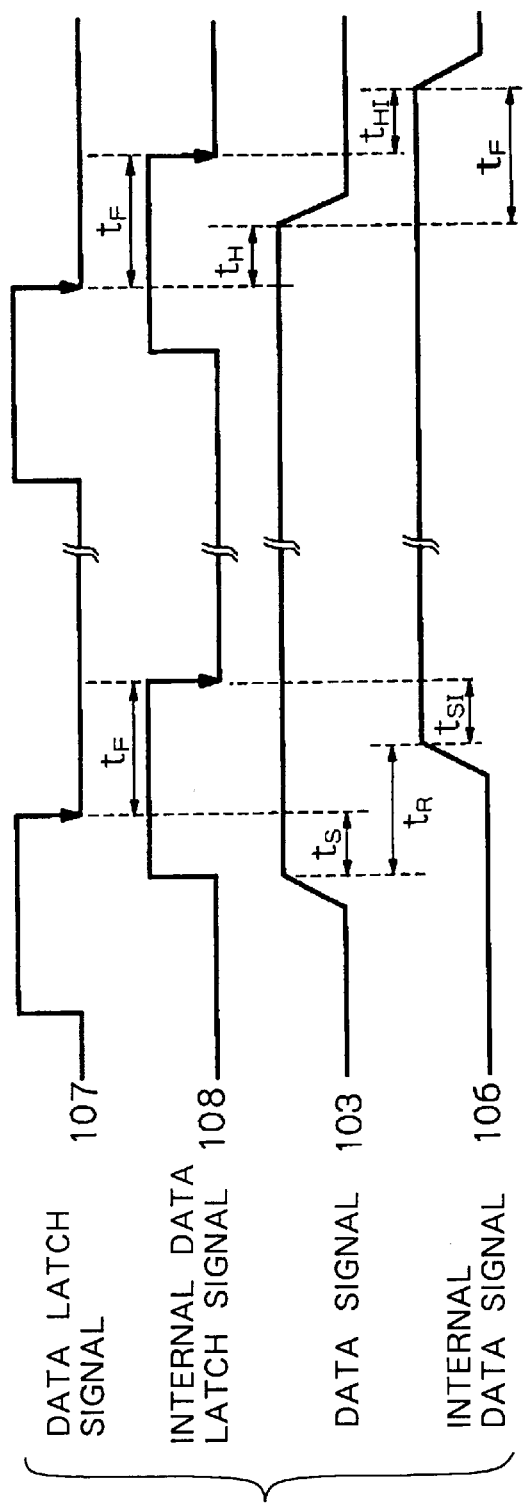
FIGS. 8A and 8B are timing charts for explaining the operation of the DDR-SDRAM.
Figure 8B:
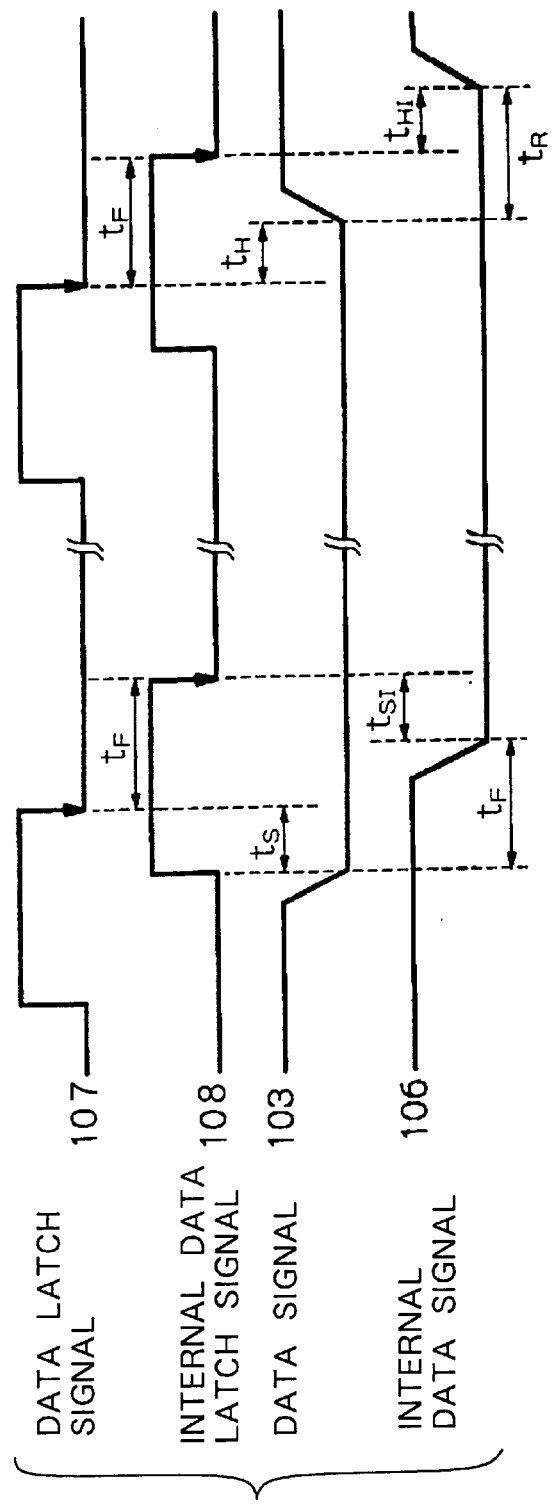
Figure 9:
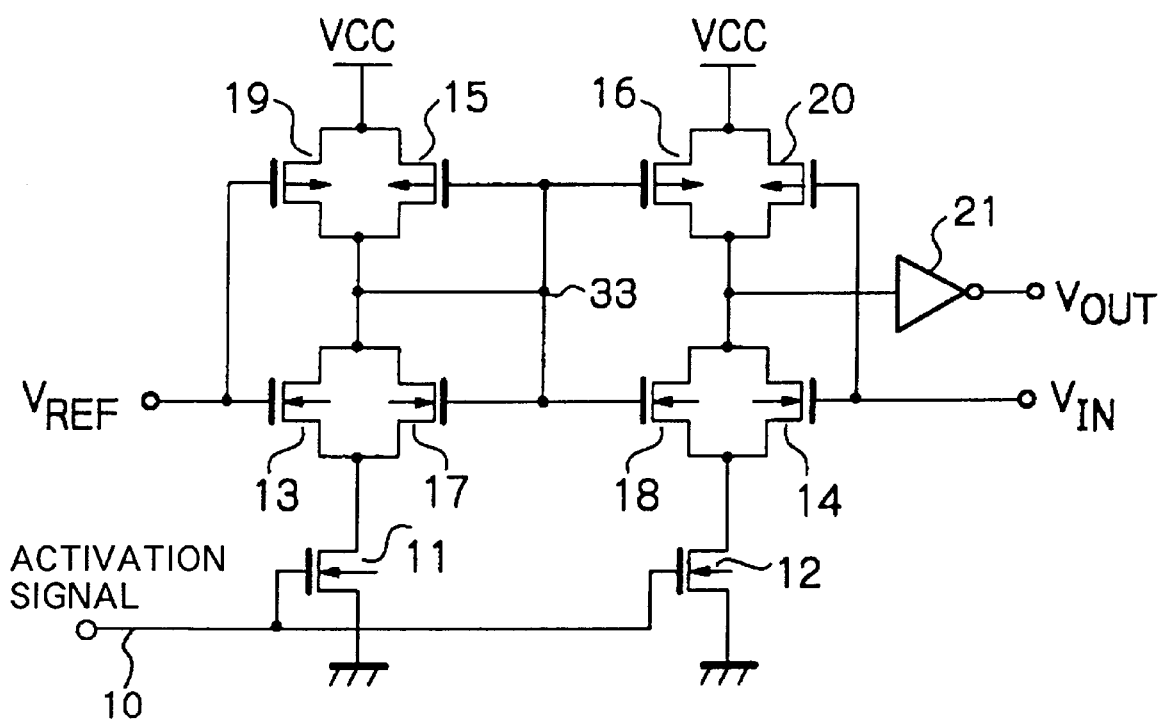
FIG. 9 is a circuit diagram showing the structure of an input receiver circuit according to a first embodiment of the present invention.

The input receiver circuit of the first embodiment of the present invention shown in FIG. 9 differs from the conventional input receiver circuit shown in FIG. 2 in that N channel MOS transistors 17 and 18, and P channel MOS transistors 19 and 20 are additionally provided. In FIG. 9, the same reference numerals as those in FIG. 2 denote the same functional components as those shown in FIG. 2.

N channel MOS transistor 17 has the gate connected to node 33, the source and the drain of which are connected to the source and the drain of N channel MOS transistor 13, respectively. Similarly, N channel MOS transistor 18 has the gate connected to node 33, the source and the drain of which are connected to the source and the drain of N channel MOS transistor 14, respectively. P channel MOS transistor 19 has the gate supplied with the reference voltage $V_{REF}$, the source and the drain of which are connected to the source and the drain of P channel MOS transistor 15, respectively. Similarly, P channel MOS transistor 20 has the gate supplied with the input signal $V_{IN}$, the source and the drain of which are connected to the source and the drain of P channel MOS transistor 16, respectively.

Figure 10A:
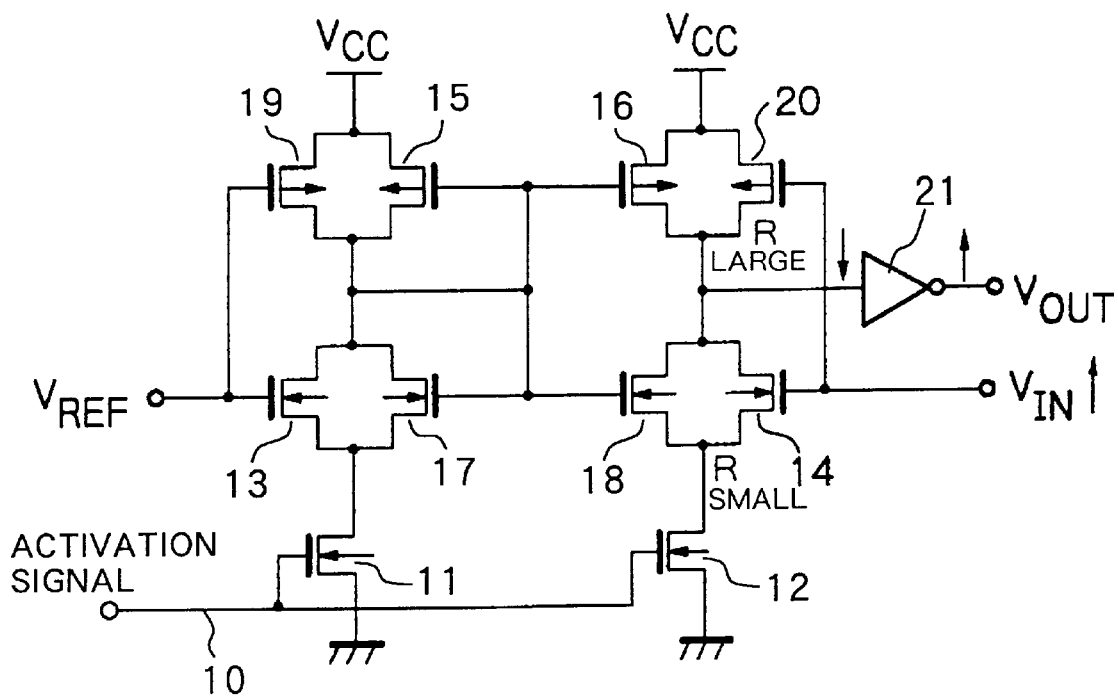
FIGS. 10A and 10B are circuit diagrams explaining an operation of the input receiver circuit shown in FIG. 9.
Figure 10B:
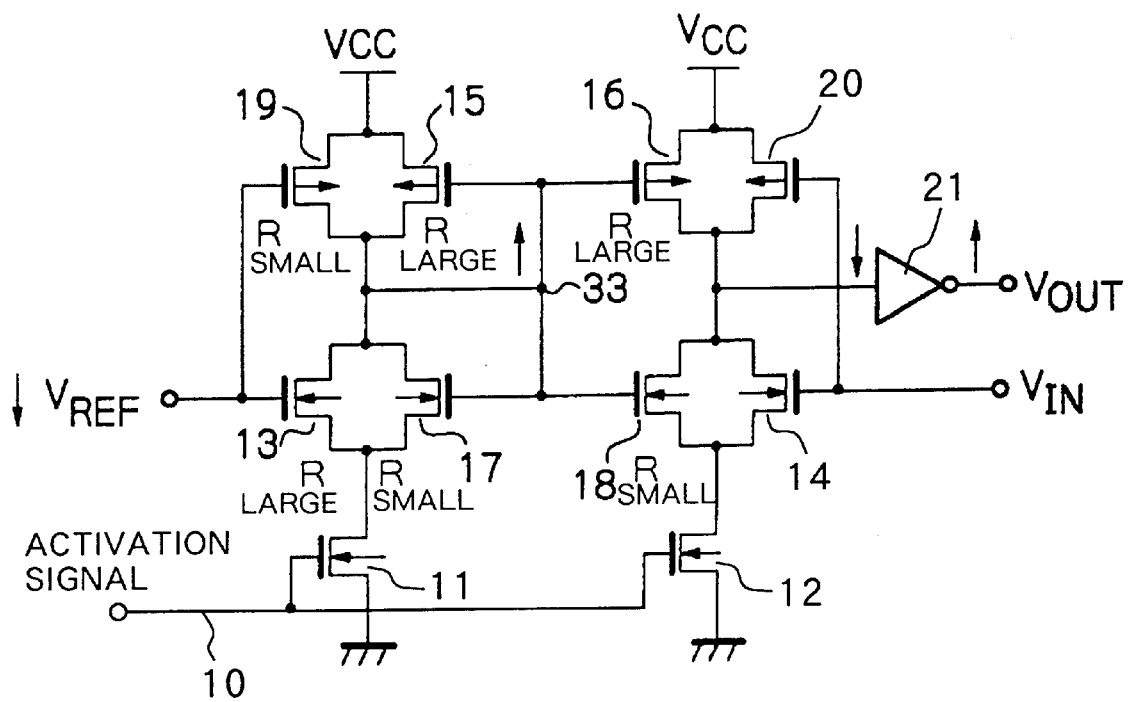

An operation of the input receiver circuit will be described with reference to FIGS. 9, 10A and 10B. The arrows in FIGS. 10A and 10B represent the rise or drop of the potential in the pertinent portions where the arrows are located. Specifically, the arrow in the upward direction represents the rise of the potential, and the arrow in the downward direction represents the drop of the potential.

When the input signal $V_{IN}$ increases, the on-resistance $R_{ON}$ of N channel MOS transistor 14 becomes small and the on-resistance of P channel MOS transistor 20 becomes large as shown in FIG. 10A, so that the drain voltage of P channel MOS transistor 20 falls more quickly. Specifically, even when the reference voltage $V_{REF}$ is low and the level of the input signal $V_{IN}$ is low, the gain can be secured with P channel MOS transistor 20.

On the other hand, when the reference voltage $V_{REF}$ becomes low, the on-resistance of N channel MOS transistor 13 becomes large and the on-resistance of P channel MOS transistor 19 becomes small as shown in FIG. 10B, so that the voltage at node 33 becomes high. Thus, the on-resistance of N channel MOS transistor 17 becomes small and the on-resistance of P channel MOS transistor 15 becomes large. Specifically, the on-resistance characteristics of N channel MOS transistor 17 and P channel MOS transistor 15 have an opposite tendency to those of N channel MOS transistor 13 and P channel MOS transistor 19, respectively. As a result, the potential at node 33 comes to be determined by the combined resistance formed by these on-resistances. The on-resistance of N channel MOS transistor 18 becomes small and the on-resistance of P channel MOS transistor 16 becomes large, so that the drain voltage of P channel MOS transistor 16 reduces. However, since an effect that the change of the reference voltage $V_{REF}$ is amplified is more suppressed compared to the conventional input receiver circuit, the input receiver circuit of this embodiment shows a flat characteristic relative to the wide range reference voltage $V_{REF}$ and performs a stable operation.

In the input receiver circuit of the present embodiment, since the input signal is supplementarily amplified also by P channel MOS transistor 20, the gain can be secured at the time when the reference voltage $V_{REF}$ is minimum and the amplification effect of the reference voltage $V_{REF}$ itself can be suppressed.

Figure 11:
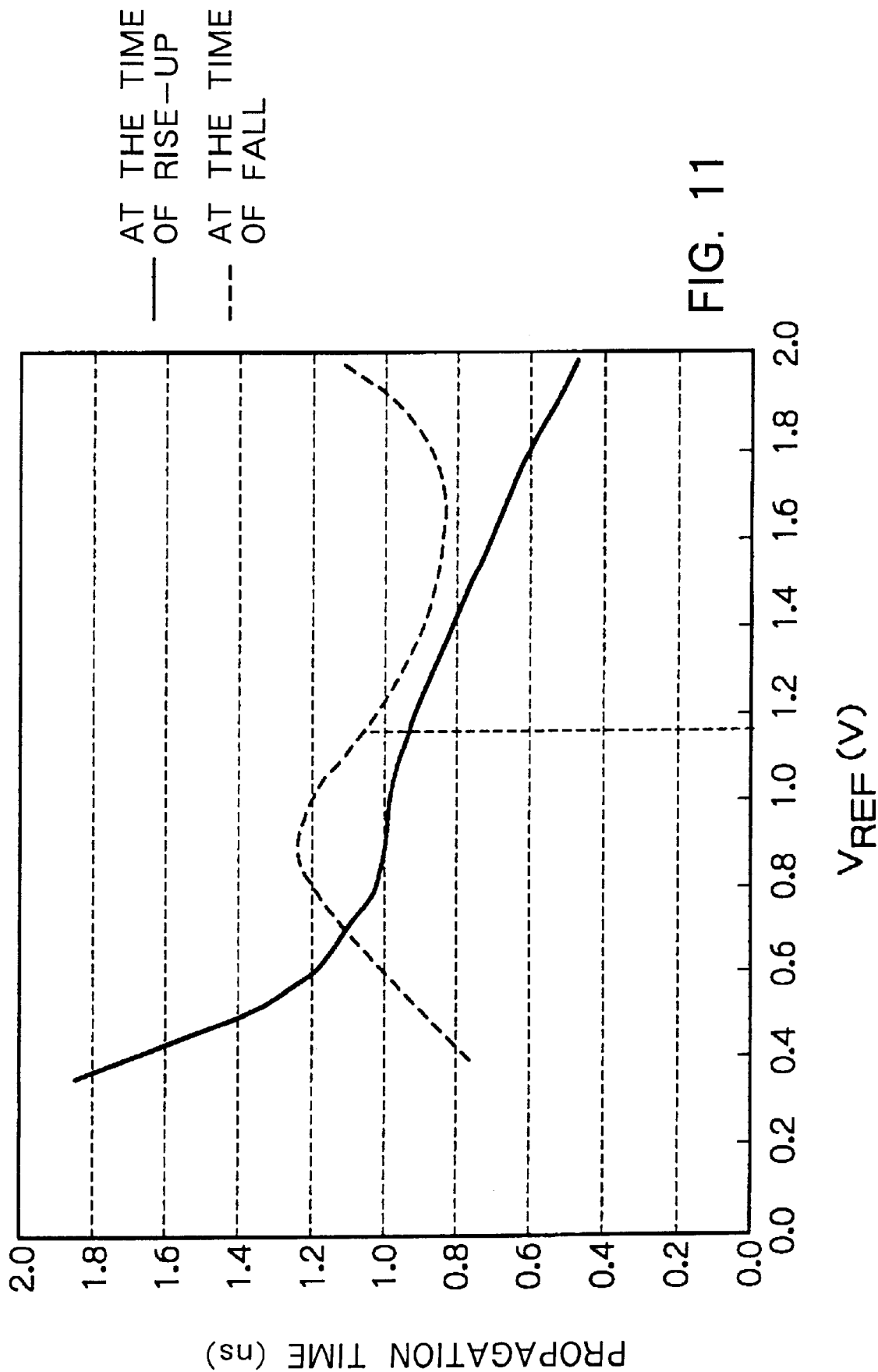
FIG. 11 is a graph showing a change of a propagation time with respect to the reference voltage $V_{REF}$ in the input receiver circuit shown in FIG. 9 when a transistor size ratio is set to 2:1.

FIG. 11 shows the results of the change of the propagation time with respect to the reference voltage $V_{REF}$ in the input receiver circuit shown in FIG. 9, which are obtained by simulations. In the graph shown in FIG. 11, the solid line represents the propagation time at the time of the rise-up and the broken line represents the propagation time at the time of the fall. In this simulation, the transistor size ratio of N channel MOS transistor 13 to N channel MOS transistor 17 shall be 2:1.

As shown in FIG. 11, when the reference voltage $V_{REF}$ is 1.15 V, the propagation time at the time of the fall is 1.08 ns and the propagation time at the time of the rise-up is 0.96 ns. At this time, the propagation time difference is 1.08−0.96= 0.12 ns, and it is smaller than the propagation time difference of 0.39 ns in the conventional input receiver circuit.

Figure 12:
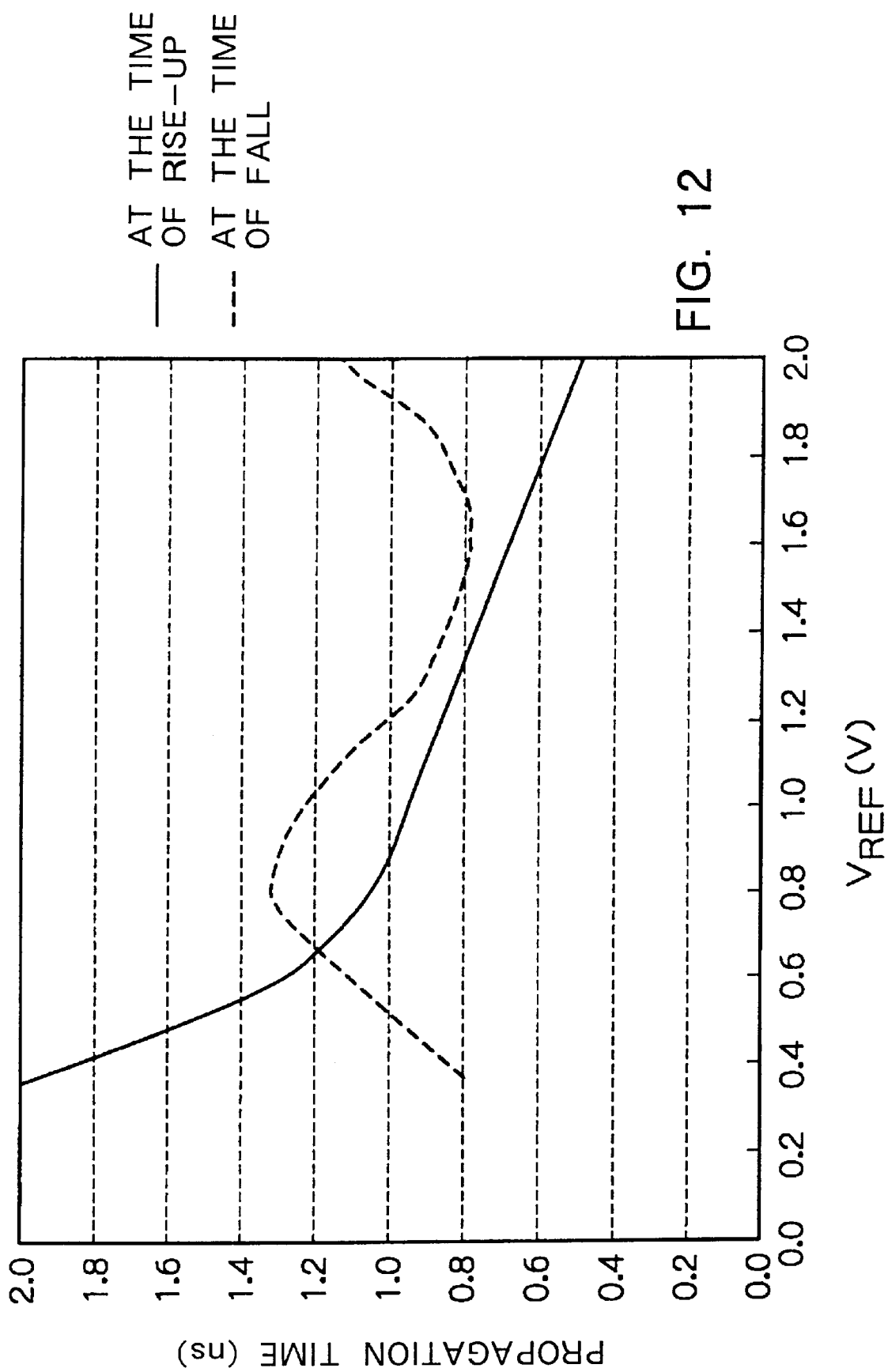
FIG. 12 is a graph showing a change of the propagation time with respect to the reference voltage $V_{REF}$ when the transistor size ratio is set to 3:1 in the input receiver circuit shown in FIG. 9.
Figure 13:
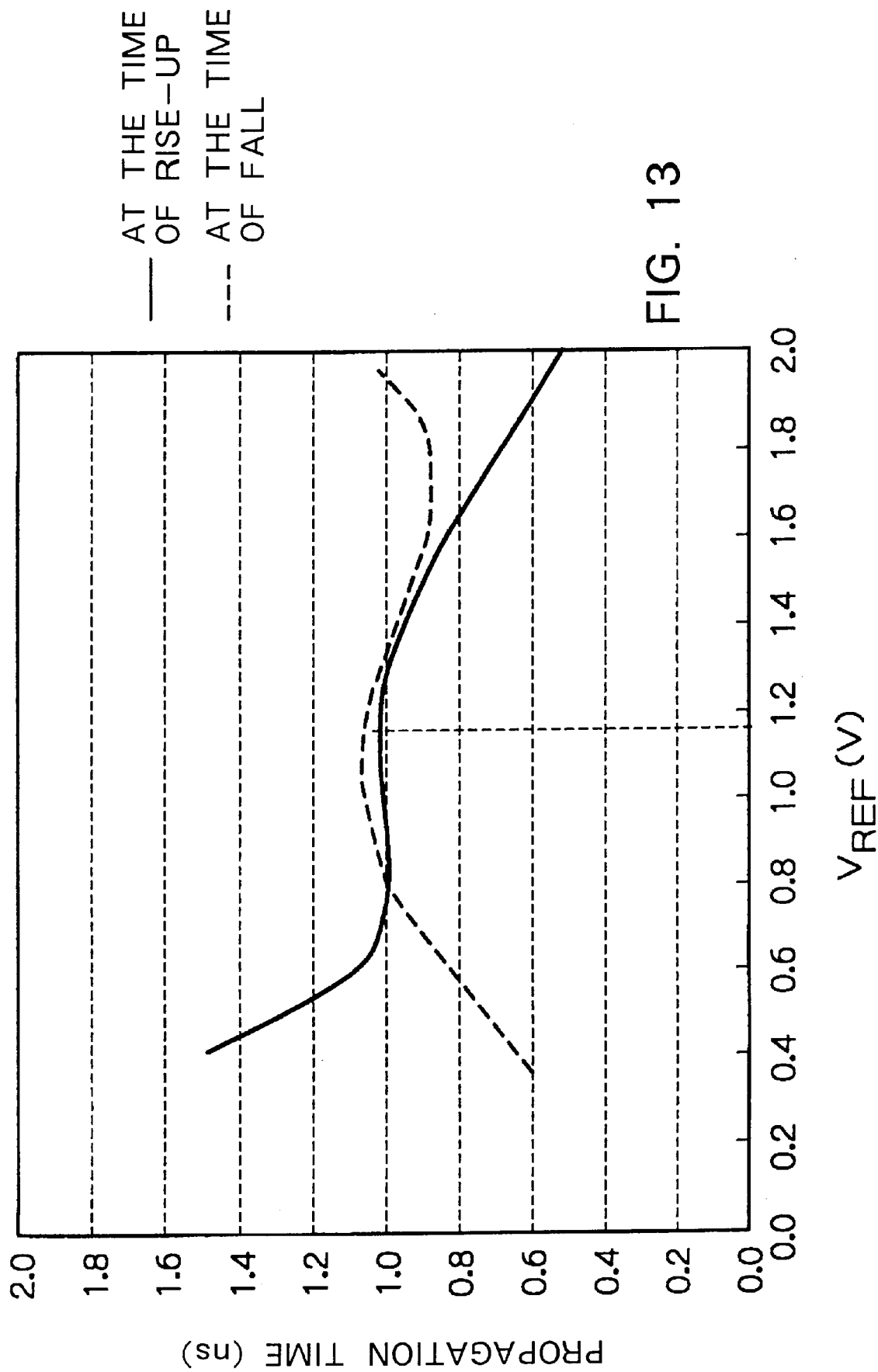
FIG. 13 is a graph showing a change of the propagation time with respect to the reference voltage $V_{REF}$ when the transistor size ratio is set to 1:1 in the input receiver circuit shown in FIG. 9.

The transistor size ratio of N channel MOS transistor 13 to N channel MOS transistor 17 is not limited to 2:1. FIGS. 12 and 13 show the change of the propagation time relative to the change of the reference voltage $V_{REF}$ when the transistor size ratio takes other values. FIG. 12 shows the change of the propagation time when the transistor size ratio of N channel MOS transistor 13 to N channel MOS transistor 17 is 3:1 and FIG. 13 shows the change of the propagation time when the transistor size ratio is 1:1.

When the transistor size ratio is 3:1, the propagation time becomes short at the time when the reference voltage $V_{REF}$ is 1.25±0.1V, and the change of the propagation time relative to the change of the reference voltage $V_{REF}$ becomes large, as shown in FIG. 12. Furthermore, when the transistor size ratio is 1:1, the propagation time becomes long. However, the change of the propagation time with respect to the change of the reference voltage $V_{REF}$ becomes small and the propagation time difference becomes small, and the characteristic curve is flat.

Therefore, considering the propagation time itself and the difference of the propagation time relative to the change of the reference voltage $V_{REF}$, the transistor size ratio is determined, whereby a desired characteristic of the input receiver circuit of the present invention can be achieved.

Figure 14:
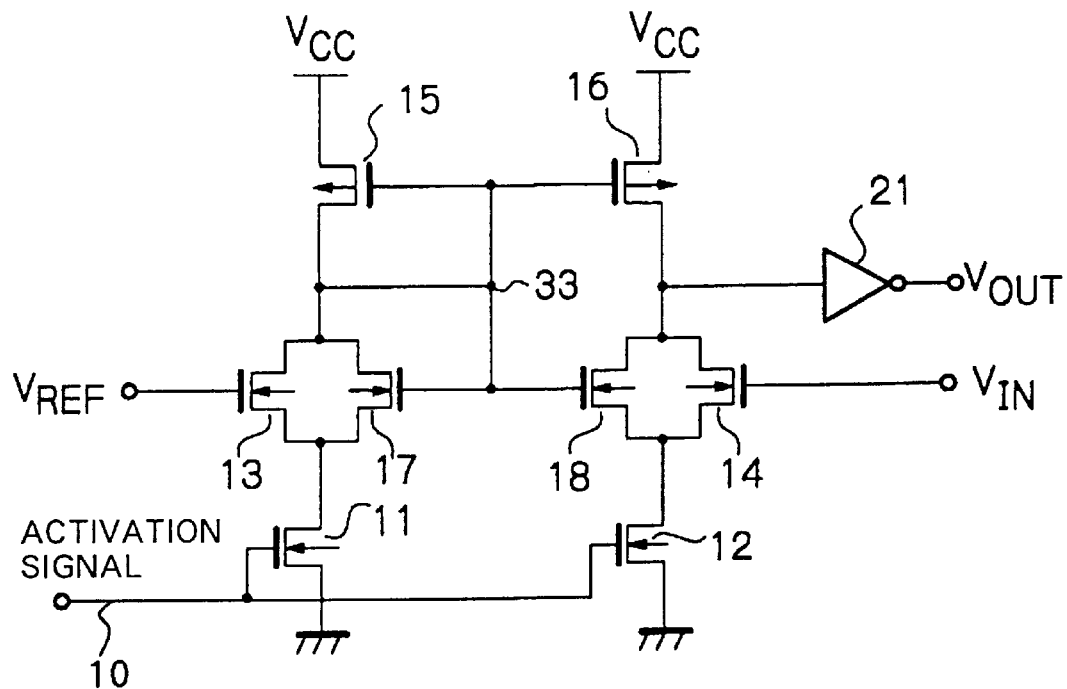
FIG. 14 is a circuit diagram showing the structure of an input receiver circuit according to a second embodiment of the present invention.

FIG. 14 shows the structure of an input receiver circuit of a second embodiment of the present invention. The input receiver circuit shown in FIG. 14 has the structure that N channel MOS transistors 19 and 20 are removed from the input receiver circuit shown in FIG. 9. Since in the input receiver circuit shown in FIG. 14 N channel MOS transistors 19 and 20 in the input receiver circuit shown in FIG. 9 are not provided, though the gain can not be secured with a low reference voltage $V_{REF}$, an amplification effect of the reference voltage $V_{REF}$ itself can be suppressed. Hence, the propagation time difference can be further reduced compared to the conventional input receiver circuit. Although an effect to reduce the propagation time difference is subtle compared to the input receiver circuit shown in FIG. 9, the circuit structure of the input receiver circuit of this embodiment shown in FIG. 14 can be simplified.

Figure 15:
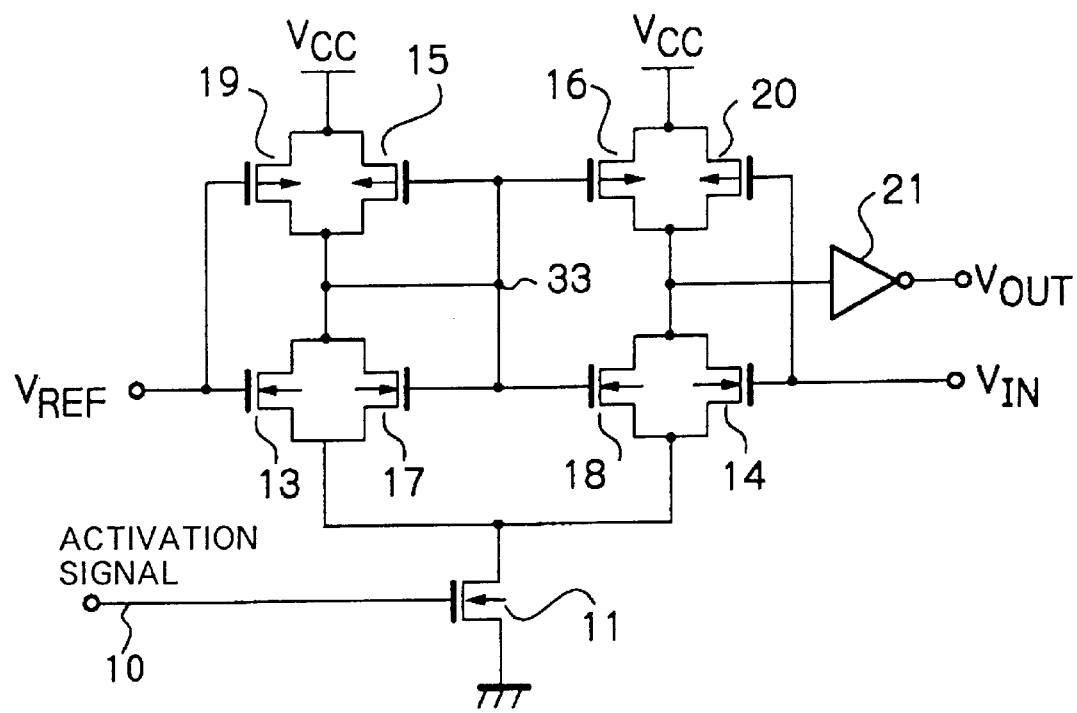
FIG. 15 is a circuit diagram showing the structure of an input receiver circuit according to a third embodiment of the present invention.

FIG. 15 shows an input receiver circuit of a third embodiment of the present invention. The receiver input circuit shown in FIG. 15 has the structure that N channel MOS transistor 11A is shared instead of N channel MOS transistors 11 and 12 for cutting off the power in the input receiver circuit shown in FIG. 9. Therefore, the sources of N channel MOS transistors 13, 14, 17 and 18 are in common connected to the drain of N channel MOS transistor 11A. The input receiver circuit shown in FIG. 15 can reduce the number of N channel MOS transistors by one and simplify the circuit structure compared to the input receiver circuit shown in FIG. 9. Although an illustration is not made, also in the input receiver circuit of the second embodiment (see FIG. 14) the power cutting N channel MOS transistors 11 and 12 can be removed and another N channel MOS transistor can be shared instead of MOS transistors 11 and 12.

So far, the preferred embodiments of the present invention were described. In the foregoing embodiments, the reference voltage $V_{REF}$ may be applied to the input receiver circuit from the outside, and may be generated within the integrated circuit including the input receiver circuit.

In the input receiver circuits of the foregoing embodiments, the distinction between the input terminal of the reference voltage $V_{REF}$ and the input terminal of the input signal $V_{IN}$ is not absolute, and a way how to use these input terminal is not limited to the foregoing ones. For example, clock signals are inputted to the input terminal of the input signal $V_{IN}$ and opposite phase clock signals are inputted to the input terminal of the reference voltage $V_{REF}$, whereby the input terminals can be used as a pair of differential clock input terminals. The opposite phase clock signal exhibits a phase opposite to the clock signal as well as a signal complementary to the clock signal.

Furthermore, the circuit structure of the input receiver circuit of the present invention is not limited to the foregoing ones. For example, when P channel MOS transistor is used instead of N channel MOS transistor in the same position of the input receiver circuit and vice versa, and the power source voltage is reversed with respect to the ground potential, an input receiver circuit which can be used similarly to the foregoing input receiver circuit can be obtained. Also the usage of the input receiver circuit of the present invention is not limited to the receipt and conversion of the input signal in the semiconductor memory device.

Although the preferred embodiments of the present invention have been described in detail, it should be understood that various changes, substitutions and alternations can be made therein without departing from spirit and scope of the inventions as defined by the appended claims.

What is claimed is:

1. An input receiver circuit comprising:
    a first N channel MOS transistor having a gate supplied with an activation signal and a source connected to a ground potential;
    a second N channel MOS transistor having a gate supplied with said activation signal and a source connected to the ground potential;
    a third N channel MOS transistor having a gate supplied with a first signal and a source connected to a drain of said first N channel MOS transistor;
    a fourth N channel MOS transistor having a gate supplied with a second signal and a source connected to a drain of said second N channel MOS transistor;
    a node;
    a fifth N channel MOS transistor having a source connected to the source of said third N channel MOS transistor, a drain connected to a drain of said third N channel MOS transistor, and a gate connected to said node;
    a sixth N channel MOS transistor having a source connected to the source of said fourth N channel MOS transistor, a drain connected to a drain of said fourth N channel MOS transistor, and a gate connected to said node;
    a first P channel MOS transistor having a source supplied with a power source voltage, a drain connected to the drain of said third N channel MOS transistor, and a gate connected to said node; and
    a second P channel MOS transistor having a source supplied with the power source voltage, a drain connected to the drain of said fourth N channel MOS transistor, and a gate connected to said node, the second P channel MOS transistor outputting a drain voltage as an output signal.

2. The input receiver circuit according to claim 1, wherein said activation signal becomes a high level potential when said input receiver circuit is to be activated, and said activation signal becomes a ground potential when said input receiver circuit is to be inactivated.

3. The input receiver circuit according to claim 1, wherein said first signal is a reference voltage signal, said second signal is an input signal, and said output signal changes depending on a level of said input signal.

4. The input receiver circuit according to claim 1, wherein said first and second signals are in a complementary relationship.

5. The input receiver circuit according to claim 1, further comprising:
    a third P channel MOS transistor having a gate applied with said first signal, a source connected to the source of said first P channel MOS transistor, and a drain connected to the drain of said first P channel MOS transistor; and
    a fourth P channel MOS transistor having a gate applied with said second signal, a source connected to the source of said second P channel MOS transistor, and a drain connected to the drain of said second P channel MOS transistor.

6. The input receiver circuit according to claim 1, wherein a transistor size ratio of said third N channel MOS transistor to said fifth N channel MOS transistor is approximately 2:1.

7. An input receiver circuit comprising:
    a first N channel MOS transistor having a gate supplied with an activation signal and a source connected to a ground potential;
    a second N channel MOS transistor having a gate supplied with a first signal and a source connected to a drain of said first N channel MOS transistor;
    a third N channel MOS transistor having a gate supplied with a second signal and a source connected to a drain of said first N channel MOS transistor;
    a node;
    a fourth N channel MOS transistor having a source connected to the source of said third N channel MOS transistor, a drain connected to said second N channel MOS transistor, and a gate connected to said node;
    a fifth N channel MOS transistor having a source connected to the source of said third N channel MOS transistor, a drain connected to a drain of said third N channel MOS transistor, and a gate connected to said node;
    a first P channel MOS transistor having a source supplied with a power source voltage, a drain connected to the drain of said second N channel MOS transistor, and a gate connected to said node; and
    a second P channel MOS transistor having a source supplied with the power source voltage, a drain connected to the drain of said third N channel NOS transistor, and a gate connected to said node, said second P channel MOS transistor outputting a drain voltage as an output signal.

8. The input receiver circuit according to claim 7, wherein said activation signal becomes a high level potential when said input receiver circuit is to be activated, and said activation signal becomes a ground potential when said input receiver circuit is to be inactivated.

9. The input receiver circuit according to claim 7, wherein said first signal is a reference voltage signal, said second signal is an input signal, and said output signal changes depending on a level of said input signal.

10. The input receiver circuit according to claim 7, wherein said first and second signals are in a complementary relationship.

11. The input receiver circuit according to claim 7, further comprising:
  a third P channel MOS transistor having a gate applied with said first signal, a source connected to the source of said first P channel MOS transistor, and a drain connected to the drain of said first P channel MOS transistor; and
  a fourth P channel MOS transistor having a gate applied with said second signal, a source connected to the source of said second P channel MOS transistor, and a drain connected to the drain of said second P channel MOS transistor.

12. The input receiver circuit according to claim 7, wherein a transistor size ratio of said second N channel MOS transistor to said fourth N channel MOS transistor is approximately 2:1.

13. An input receiver circuit comprising:
  a first MOS transistor of one conductivity type having a gate supplied with an activation signal and a source connected to a ground potential;
  a second MOS transistor of the one conductivity type having a gate supplied with said activation signal and a source connected to the ground potential;
  a third MOS transistor of the one conductivity type having a gate supplied with a first signal and a source connected to a drain of said first MOS transistor;
  a fourth MOS transistor of the one conductivity type having a gate supplied with a second signal and a source connected to a drain of said second MOS transistor;
  a node;
  a fifth MOS transistor of the one conductivity type having a source connected to the source of said third MOS transistor, a drain connected to a drain of said third MOS transistor, and a gate connected to said node;
  a sixth MOS transistor of the one conductivity type having a source connected to the source of said fourth MOS transistor, a drain connected to a drain of said fourth MOS transistor, and a gate connected to said node;
  a seventh MOS transistor of an opposite conductivity type having a source supplied with a power source voltage, a drain connected to the drain of said third MOS transistor, and a gate connected to said node; and
  an eighth MOS transistor of the opposite conductivity type having a source supplied with the power source voltage, a drain connected to the drain of said fourth MOS transistor, and a gate connected to said node, the eighth MOS transistor outputting a drain voltage as an output signal.

14. An input receiver circuit comprising:
  a first MOS transistor of one conductivity type having a gate supplied with an activation signal and a source connected to a ground potential;
  a second MOS transistor of the one conductivity type having a gate supplied with a first signal and a source connected to a drain of said first MOS transistor;
  a third MOS transistor of the one conductivity type having a gate supplied with a second signal and a source connected to a drain of said first MOS transistor;
  a node;
  a fourth MOS transistor of the one conductivity type having a source connected to the source of said third MOS transistor, a drain connected to said second MOS transistor, and a gate connected to said node;
  a fifth MOS transistor of the one conductivity type having a source connected to the source of said third MOS transistor, a drain connected to a drain of said third MOS transistor, and a gate connected to said node;
  a sixth MOS transistor of an opposite conductivity type having a source supplied with a power source voltage, a drain connected to the drain of said second MOS transistor, and a gate connected to said node; and
  a seventh MOS transistor of the opposite conductivity type having a source supplied with the power source voltage, a drain connected to the drain of said third MOS transistor, and a gate connected to said node, said seventh MOS transistor outputting a drain voltage as an output signal.

* * * * *